(12) United States Patent
Weng et al.

(10) Patent No.: US 9,363,881 B2
(45) Date of Patent: Jun. 7, 2016

(54) PLASMA DEVICE AND OPERATION METHOD OF PLASMA DEVICE

(71) Applicant: Industrial Technology Research Institute, Hsinchu (TW)

(72) Inventors: Chih-Chiang Weng, Taoyuan County (TW); Jui-Mei Hsu, Hsinchu County (TW); Chen-Chung Du, Hsinchu (TW); Chen-Der Tsai, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/547,149

(22) Filed: Nov. 19, 2014

(65) Prior Publication Data

US 2015/0156857 A1 Jun. 4, 2015

(30) Foreign Application Priority Data

Dec. 4, 2013 (TW) .............................. 102144496 A

(51) Int. Cl.
*H01J 7/24* (2006.01)
*H05H 1/46* (2006.01)
(Continued)

(52) U.S. Cl.
CPC ............ *H05H 1/46* (2013.01); *H01J 37/32009* (2013.01); *H01J 37/32348* (2013.01);
(Continued)

(58) Field of Classification Search
CPC ...... H05H 1/46; H01J 37/3208; G09G 3/2927
USPC .............. 315/111.21, 111.51, 111.91; 345/60
See application file for complete search history.

(56) References Cited

U.S. PATENT DOCUMENTS 6,824,363 B2  11/2004  Mitrovic et al.
7,022,937 B2   4/2006  Okumura et al.
(Continued)

FOREIGN PATENT DOCUMENTS

TW   I295547   4/2008
TW   I300957   9/2008
(Continued)

OTHER PUBLICATIONS

"Office Action of Taiwan Counterpart Application", issued on Nov. 25, 2014, p. 1-p. 3.
(Continued)

*Primary Examiner* — Douglas W Owens
*Assistant Examiner* — Syed M Kaiser
(74) *Attorney, Agent, or Firm* — Jianq Chyun IP Office

(57) ABSTRACT

A plasma device includes a dielectric barrier, a first electrode structure, a second electrode structure, and a third electrode structure. The dielectric barrier has an upstream terminal and a downstream terminal and defines a space, in which the first electrode structure is disposed. A gap with multiple widths is formed between the first electrode structure and the dielectric barrier. The dielectric barrier is located between the first electrode structure and the second electrode structure. The second electrode structure includes electrode blocks sequentially arranged from the upstream terminal to the downstream terminal. The dielectric barrier, the first electrode structure, and the second electrode structure are located on the same side of the third electrode structure located at the downstream terminal. A minimum distance between the electrode blocks and the third electrode structure is not less than a distance between the first electrode structure and the third electrode structure.

29 Claims, 12 Drawing Sheets

(51) Int. Cl.
 *H01J 37/32* (2006.01)
 *H05H 1/24* (2006.01)
(52) U.S. Cl.
 CPC ..... *H01J 37/32541* (2013.01); *H01J 37/32568* (2013.01); *H05H 1/2406* (2013.01); *H05H 2001/2412* (2013.01)

(56) References Cited

U.S. PATENT DOCUMENTS

| | | | |
|---|---|---|---|
| 7,335,850 B2 | 2/2008 | Kuo | |
| 8,373,088 B2 | 2/2013 | Kang | |
| 8,492,733 B1 | 7/2013 | Klochkov et al. | |
| 8,928,230 B2 * | 1/2015 | Watson | A61M 16/12 315/111.21 |
| 2003/0080926 A1 * | 5/2003 | Morimoto | G09G 3/2025 345/60 |
| 2006/0189168 A1 * | 8/2006 | Sato | C01B 13/11 438/795 |
| 2006/0232511 A1 * | 10/2006 | Uemura | H01J 11/12 345/60 |
| 2007/0008247 A1 * | 1/2007 | Cho | H01J 11/38 345/67 |
| 2009/0068375 A1 | 3/2009 | Dobbyn et al. | |
| 2009/0159811 A1 | 6/2009 | Klemm et al. | |
| 2009/0166326 A1 | 7/2009 | Sexton et al. | |
| 2009/0233387 A1 | 9/2009 | White | |
| 2010/0164381 A1 | 7/2010 | Chang et al. | |
| 2010/0193129 A1 * | 8/2010 | Tabata | C23C 16/505 156/345.35 |
| 2010/0265078 A1 * | 10/2010 | Friedman | G01T 1/26 340/600 |
| 2011/0095682 A1 * | 4/2011 | Cho | H01J 11/46 313/582 |
| 2015/0010430 A1 * | 1/2015 | Kitano | A61L 2/14 422/22 |
| 2015/0122625 A1 * | 5/2015 | Seo | G06F 3/044 200/5 R |
| 2015/0184300 A1 * | 7/2015 | Starostine | C23C 16/401 428/312.2 |

FOREIGN PATENT DOCUMENTS

| | | |
|---|---|---|
| TW | 200915930 | 4/2009 |
| TW | 200931474 | 7/2009 |
| TW | 200938010 | 9/2009 |
| TW | 201130402 | 9/2011 |
| TW | 201239981 | 10/2012 |
| WO | 2004068916 | 8/2004 |
| WO | 2008075817 | 6/2008 |

OTHER PUBLICATIONS

Jidenko et al., "Self-cleaning, maintenance-free aerosol filter by non-thermal plasma at atmospheric pressure," Journal of Hazardous Materials, Oct. 15, 2012, pp. 235-236.
Moon et al., "A uniform glow discharge plasma source at atmospheric pressure," Applied Physics Letters, Jan. 12, 2004, pp. 188-190.
Da Ponte et al., "Atmospheric pressure plasma deposition of organic films of biomedical interest," Surface & Coatings Technology, Jul. 25, 2011, pp. S525-S528.
Sakurai et al., "Hardness and surface roughness of hydrogenated amorphous carbon films synthesized by atmospheric pressure plasma enhanced CVD method with various pulse frequencies," Surface & Coatings Technology, Jan. 25, 2013, pp. 460-464
Panda et al., "Functionalization of cellulosic substrate using He/dodecyl acrylate plasma at atmospheric pressure," Surface & Coatings Technology, Jun. 25, 2013, pp. 97-105.
De Geyter et al., "DBD treatment of polyethylene terephthalate: Atmospheric versus medium pressure treatment," Surface & Coatings Technology, Mar. 25, 2008, pp. 3000-3010.
Kim et al., "Superhydrophobic CFx Coating via In-Line Atmospheric RF Plasma of He-CF4-H2," Langmuir, Dec. 2005, pp. 12213-12217.
Xu et al., "Formation of hydrophobic coating on PMMA surface using unipolar nanosecond-pulse DBD in atmospheric air," Journal of Electrostatics, Jun. 2013, pp. 435-439.

* cited by examiner

PLASMA DEVICE AND OPERATION METHOD OF PLASMA DEVICE

CROSS-REFERENCE TO RELATED APPLICATION

This application claims the priority benefit of Taiwan application serial no. 102144496, filed on Dec. 4, 2013. The entirety of the above-mentioned patent application is hereby incorporated by reference herein and made a part of this specification.

BACKGROUND

1. Technical Field

This disclosure relates to a plasma device and an operation method of the plasma device.

2. Description of Related Art

The plasma technology has been extensively used in various industries, such as photoelectric and semiconductor-related industries, 3C and automotive part industries, livelihood and food chemical industries, biomedical material industry, painting and adhesive pre-processing industries, and air and water pollution processing industries. Plasma devices that are operable under the normal pressure have been developed based on the current plasma technology, e.g. direct type or remote type plasma technology.

The direct type plasma technology refers to a technique that exposes a workpiece in an electric field to cause direct contact between the workpiece and the plasma. Nevertheless, the high electric field and current in the plasma may cause damage to an electrically conductive workpiece. For this reason, applicability of the direct type plasma is limited. The remote type plasma technology refers to a technique that uses a grounded metal to shield the electric field/current in the plasma and drives the plasma to the workpiece by airflow. Thus, the concern of damaging the workpiece in the direct type plasma technology is resolved. In the remote type plasma technology, however, the plasma's traveling to the workpiece may reduce the plasma energy and result in insufficient plasma energy.

SUMMARY

This disclosure provides a plasma device that effectively performs plasma processing on a workpiece and does not easily damage the workpiece.

This disclosure provides an operation method of the plasma device for effectively performing plasma processing on a workpiece and avoiding damaging the workpiece during the plasma processing.

An embodiment of the disclosure provides a plasma device that includes a dielectric barrier, a first electrode structure, a second electrode structure, and a third electrode structure. The dielectric barrier has an upstream terminal and a downstream terminal and defines a space. The first electrode structure is disposed in the space. A gap is formed between the first electrode structure and the dielectric barrier, and the gap has multiple widths. The second electrode structure is disposed around the first electrode structure. The dielectric barrier is located between the first electrode structure and the second electrode structure. The second electrode structure includes a plurality of electrode blocks that are arranged in sequence from the upstream terminal to the downstream terminal. The dielectric barrier, the first electrode structure, and the second electrode structure are located on the same side of the third electrode structure, and the third electrode structure is located at the downstream terminal of the dielectric barrier. A minimum distance between the electrode blocks and the third electrode structure is not less than a distance between the first electrode structure and the third electrode structure.

An embodiment of the disclosure provides an operation method of a plasma device that includes a dielectric barrier, a first electrode structure, a second electrode structure, and a third electrode structure. The dielectric barrier has an upstream terminal and a downstream terminal and defines a space. The first electrode structure is disposed in the space. A gap is formed between the first electrode structure and the dielectric barrier, and the gap has multiple widths. The second electrode structure is disposed around the first electrode structure. The dielectric barrier is located between the first electrode structure and the second electrode structure. The second electrode structure includes a plurality of electrode blocks that are arranged in sequence from the upstream terminal to the downstream terminal. The dielectric barrier, the first electrode structure, and the second electrode structure are located on the same side of the third electrode structure, and the third electrode structure is located at the downstream terminal of the dielectric barrier. A minimum distance between the electrode blocks and the third electrode structure is not less than a distance between the first electrode structure and the third electrode structure. Moreover, the operation method of the plasma device includes the following: placing a workpiece between the dielectric barrier and the third electrode structure; introducing a first fluid into the space from the upstream terminal; applying a first operating voltage to the first electrode structure; applying a second operating voltage to at least one of the electrode blocks of the second electrode structure; and applying a third operating voltage to the third electrode structure.

Several exemplary embodiments accompanied with figures are described in detail below to further describe the disclosure in detail.

BRIEF DESCRIPTION OF THE DRAWINGS

The accompanying figures are included to provide further understanding, and are incorporated in and constitute a part of this specification. The figures illustrate exemplary embodiments and, together with the description, serve to explain the principles of the disclosure.

DETAILED DESCRIPTION OF DISCLOSED EMBODIMENTS

Figure 1A:
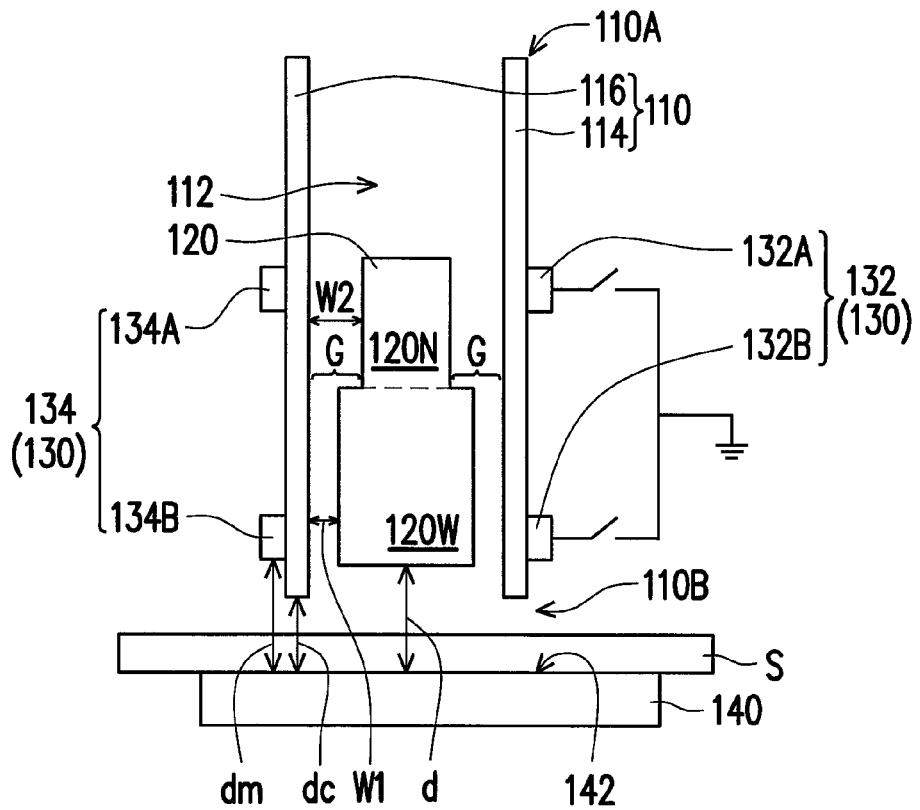
FIG. 1A is a partial cross-sectional view of a plasma device according to the first embodiment of the disclosure.

FIG. 1A is a partial cross-sectional view of a plasma device according to the first embodiment of the disclosure. With reference to FIG. 1A, a plasma device 100 includes a dielectric barrier 110, a first electrode structure 120, a second electrode structure 130, and a third electrode structure 140. The dielectric barrier 110 has an upstream terminal 110A and a downstream terminal 110B, and the dielectric barrier 110 defines a space 112. The first electrode structure 120 is disposed in the space 112. A gap G is formed between the first electrode structure 120 and the dielectric barrier 110. The second electrode structure 130 is disposed around the first electrode structure 120. The dielectric barrier 110 is located between the first electrode structure 120 and the second electrode structure 130. The second electrode structure 130 includes a plurality of electrode blocks 132 and 134. The dielectric barrier 110, the first electrode structure 120, and the second electrode structure 130 are located on the same side of the third electrode structure 140, and the third electrode structure 140 is located at the downstream terminal 110B of the dielectric barrier 110. Here, a material of the first electrode structure 120, the second electrode structure 130, and the third electrode structure 140 may include a metal, an alloy, or other conductive materials that may be used to form an electrode. However, the first electrode structure 120, the second electrode structure 130, and the third electrode structure 140 are not necessarily made of one single material. In addition, a surface of any one of the first electrode structure 120, the second electrode structure 130, and the third electrode structure 140 may have a metal oxide layer for preventing an arc discharge phenomenon between the electrodes.

The gap G formed between the first electrode structure 120 and the dielectric barrier 110 has multiple widths. A first width W1 of the gap G near the downstream terminal 110B is less than a second width W2 of the gap G away from the downstream terminal 110B. In this embodiment, the first electrode structure 120 has a first width portion 120W and a second width portion 120N, wherein a width of the first width portion 120W is greater than a width of the second width portion 120N, and the first width portion 120W is located between the second width portion 120N and the third electrode structure 140. Further, it is known from FIG. 1A that a cross section of the first electrode structure 120 has a stepped outline. However, it should be noted that this disclosure is not limited thereto.

Figure 1B:
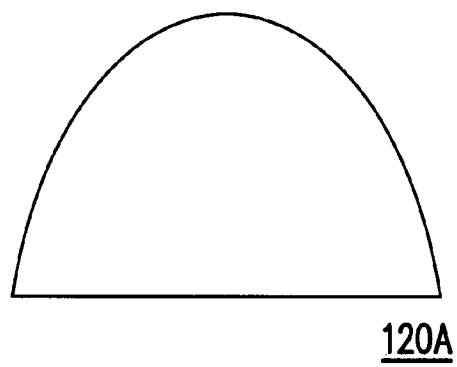
FIG. 1B illustrates an embodiment of a first electrode structure.
Figure 1C:
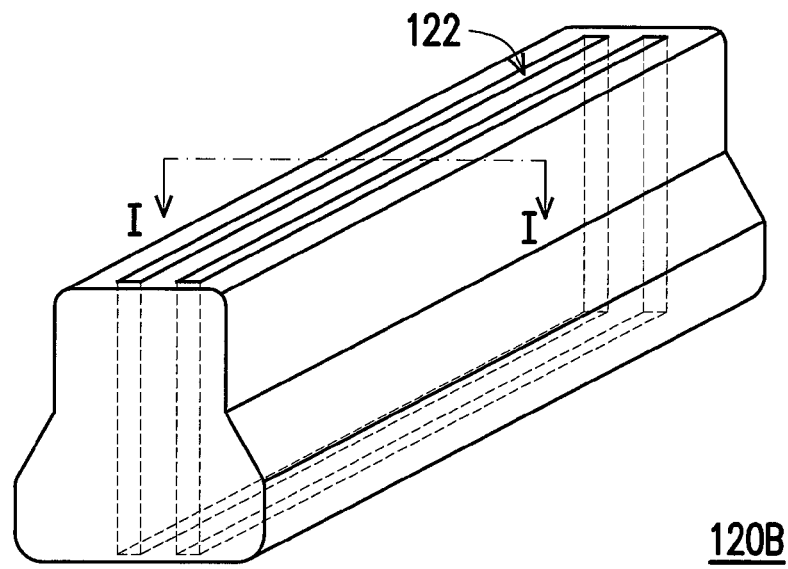
FIG. 1C illustrates another embodiment of the first electrode structure.
Figure 1D:
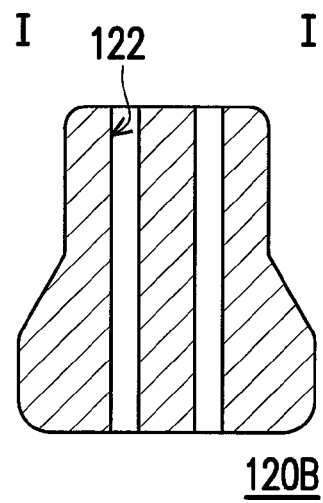
FIG. 1D is a cross-sectional view of the first electrode structure of FIG. 1C taken along the line I-I.
Figure 1E:
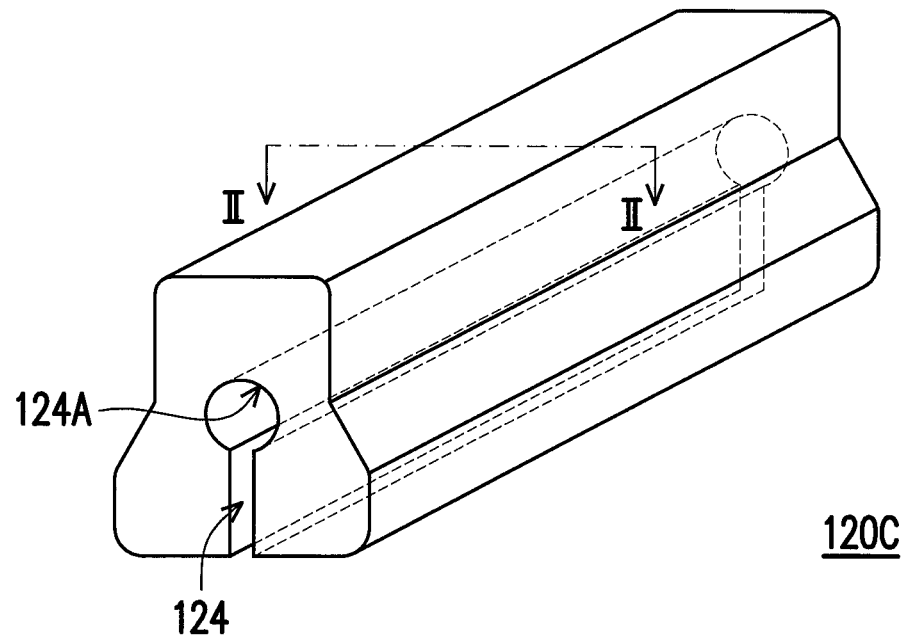
FIG. 1E illustrates yet another embodiment of the first electrode structure.
Figure 1F:
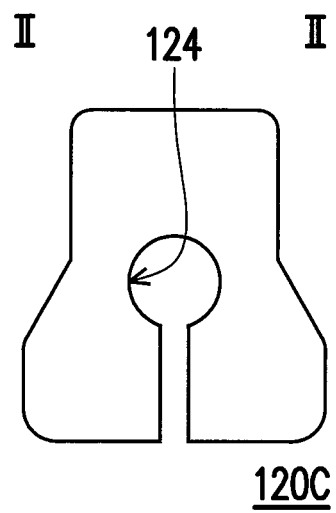
FIG. 1F is a cross-sectional view of the first electrode structure of FIG. 1E taken along the line II-II.

Regarding other embodiments, FIG. 1B illustrates another embodiment of the first electrode structure. A cross section of a first electrode structure 120A may selectively have an island-shaped outline or the like. Here, a width of the first electrode structure 120A may increase as being closer to the downstream terminal 110B (see FIG. 1). Therefore, the width of the gap G (see FIG. 1) decreases as being closer to the downstream terminal 110B. Moreover, FIG. 1C illustrates another embodiment of the first electrode structure, and FIG. 1D is a cross-sectional view of the first electrode structure of FIG. 1C taken along the line I-I. It is known from FIG. 1C and FIG. 1D that a first electrode structure 120B has at least one through hole 122. When the first electrode structure 120B is applied to the plasma device 100 of FIG. 1, the through hole 122 is adapted to allow a fluid to flow from the upstream terminal 110A to the downstream terminal 110B through the through hole 122. That is to say, when the first electrode structure 120B is applied to the plasma device 100 of FIG. 1, the fluid injected from the upstream terminal 110A flows to the downstream terminal 110B not only through the gap G but also through the through hole 122. FIG. 1E illustrates yet another embodiment of the first electrode structure, and FIG. 1F is a cross-sectional view of the first electrode structure of FIG. 1E taken along the line II-II. It is known from FIG. 1E and FIG. 1F that a first electrode structure 120C has at least one fluid through hole 124. The fluid through hole 124 has an inflow end 124A. When the first electrode structure 120C is applied to the plasma device 100 of FIG. 1, a fluid is allowed to flow from the inflow end 124A to the downstream terminal 110B through the fluid through hole 124. Because the fluid through hole 124 does not communicate with the upstream terminal 110A, the fluid injected from the inflow end 124A may be different from the fluid introduced from the upstream terminal 110A. However, the fluid injected from the inflow end 124A may be the same as the fluid introduced from the upstream terminal 110A. Here, regardless of the design of the shape of the first electrode structure 120, the surface of the first electrode structure 120 may have a surface oxide layer for preventing the arc discharge phenomenon between the first electrode structure and other conductive components.

In terms of the design of this embodiment, the multiple widths of the gap G is determined by the outline of the first electrode structure 120. However, it should be noted that this disclosure is not limited thereto. In other embodiments, the multiple widths of the gap G may be determined by an outline of the dielectric barrier 110. In other words, this disclosure does not substantially limit the configuration of the multiple widths of the gap G as long as the width between the first electrode structure 120 and the dielectric barrier 110 decreases near the upstream terminal 110A and increases near the downstream terminal 110B.

In this embodiment, the dielectric barrier 110 includes a first baffle 114 and a second baffle 116, and a material of the dielectric barrier 110 includes quartz or other ceramic materials, e.g. aluminum oxide, which have favorable temperature resistance and a high dielectric constant. The first baffle 114 and the second baffle 116 are disposed opposite to each other to form the space 112 and define the upstream terminal 110A and the downstream terminal 110B of the space 112. Here, the second electrode structure 130 is divided into two portions, wherein one portion includes a plurality of electrode blocks 132 and the other portion includes a plurality of electrode blocks 134. The first baffle 114 is located between the electrode blocks 132 and the first electrode structure 120, and the second baffle 116 is located between the electrode blocks 134 and the first electrode structure 120. An electrode block 132A and an electrode block 132B, among the electrode blocks 132, are arranged in sequence from the upstream terminal to the downstream terminal. An electrode block 134A and an electrode block 134B, among the electrode blocks 134, are arranged in sequence from the upstream terminal to the downstream terminal. In addition, the electrode block 132A and the electrode block 132B located at different positions, i.e. upstream and downstream, may be electrically driven independently, and the electrode block 134A and the electrode block 134B located at different positions, i.e. upstream and downstream, may be electrically driven independently. However, the electrode block 132A and the electrode block 134A located at similar heights may be driven independently or synchronously. Moreover, the electrode block 132B and the electrode block 134B located at similar heights may be driven independently or synchronously. Therefore, when being driven, the electrode block 132A and the electrode block 134A may have the same potential, and the electrode block 132B and the electrode block 134B may have the same potential.

Further to the above, in an embodiment, the dielectric barrier 110 may be designed as a movable dielectric barrier. Therefore, a distance between the dielectric barrier 110 and the third electrode structure 140 is changeable. In other words, a distance dc between the dielectric barrier 110 and the third electrode structure 140 may be reduced or increased as required during the fabrication process. In another embodiment, even though the dielectric barrier 110 is movable, the position of the dielectric barrier 110 remains shielding between the first electrode structure 120 and the second electrode structure 130.

The first electrode structure 120 in the space 112 and the second electrode structure 130 outside the dielectric barrier 110 are configured to ignite or generate plasma. In this embodiment, a minimum distance dm between the electrode blocks 132 and 134 and the third electrode structure 140 is not less than a distance d between the first electrode structure 120 and the third electrode structure 140. It is known from this embodiment that the electrode blocks 132 and 134 are located substantially around the first electrode structure 120 and are not too far away from the first electrode structure 120.

In this embodiment, the third electrode structure 140 has a platform-shaped structure. Thus, the third electrode structure 140 has a carrying surface 142 for carrying a workpiece S and keeping the workpiece S between the third electrode structure 140 and the first electrode structure 120. That is to say, the third electrode structure 140 is substantially implemented using a carrying platform that can be electrified. However, this disclosure is not limited thereto. In other embodiments, the third electrode structure 140 may be an electrode disposed on a carrying platform and does not have a certain area for carrying the workpiece S.

In the plasma device 100 of this embodiment, gas is introduced into the space 112 through the upstream terminal 110A of the dielectric barrier 110. Meanwhile, an operating voltage is applied to the first electrode structure 120 and the second electrode structure 130 to cause the gas flowing to the gap G to generate plasma due to an electric field. In other words, generation of the plasma substantially takes place in the gap G. In this embodiment, the gap G has the multiple widths for reducing plasma obstruction in the gap G. The widths of the gap G may be in a range of 0.2 mm to 2 mm, for example.

Moreover, in this embodiment, after the plasma is generated in the gap G, an operating voltage is applied to the third electrode structure 140 to expand the plasma to the space between the first electrode structure 120 and the third electrode structure 140 for processing the workpiece S. When the workpiece S is processed by the plasma, at least a portion of the electrode blocks (e.g. the electrode blocks 132A, 134A, 132B, and 134B, or all the electrode blocks) of the second electrode structure 130 may be applied with the operating voltage as well. At the moment, corresponding electric fields are generated between the first electrode structure 120 and the third electrode structure 140 and between the first electrode structure 120 and the second electrode structure 130.

Figure 2:
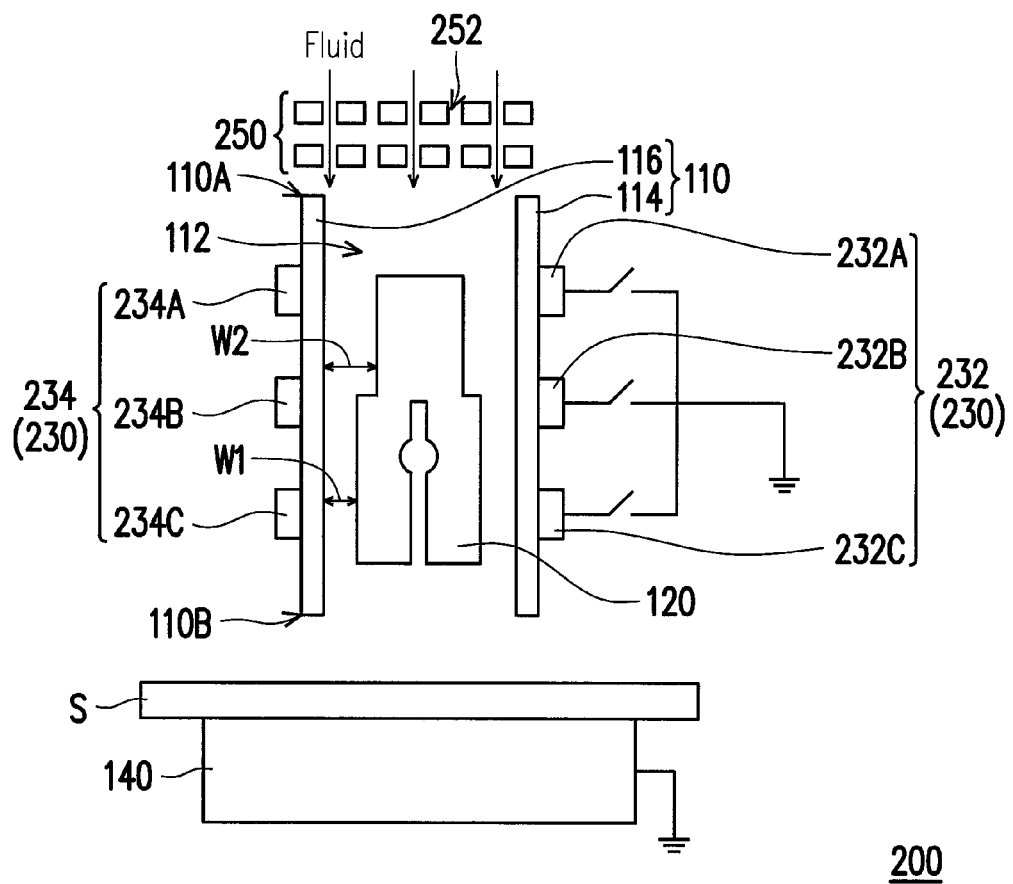
FIG. 2 is a partial cross-sectional view of the plasma device according to the second embodiment of the disclosure.

FIG. 2 is a partial cross-sectional view of the plasma device according to the second embodiment of the disclosure. With reference to FIG. 2, components of a plasma device 200 are similar to the components of the plasma device 100 of the first embodiment. Thus, the same reference numerals are used to represent the same components in the two embodiments. More specifically, in this embodiment, a second electrode structure 230 includes two portions, wherein one portion includes a plurality of electrode blocks 232 on an external side of a first baffle 114 and the other portion includes a plurality of electrode blocks 234 on an external side of a second baffle 116. The electrode blocks 232 include electrode blocks 232A, 232B, and 232C. The electrode blocks 234 include electrode blocks 234A, 234B, and 234C. The electrode blocks 232A, 232B, and 232C are arranged in sequence from the upstream terminal 110A to the downstream terminal 110B. The electrode blocks 234A, 234B, and 234C are arranged in sequence from the upstream terminal 110A to the downstream terminal 110B as well. In addition, in this embodiment, the plasma device 200 further includes a fluid introducing element 250, e.g. a baffle having a plurality of openings 252, for controlling uniformity of introducing the fluid into the space 112. An operation mode and the design of other components of the plasma device 200 may be inferred from the descriptions of the first embodiment.

Figure 3:
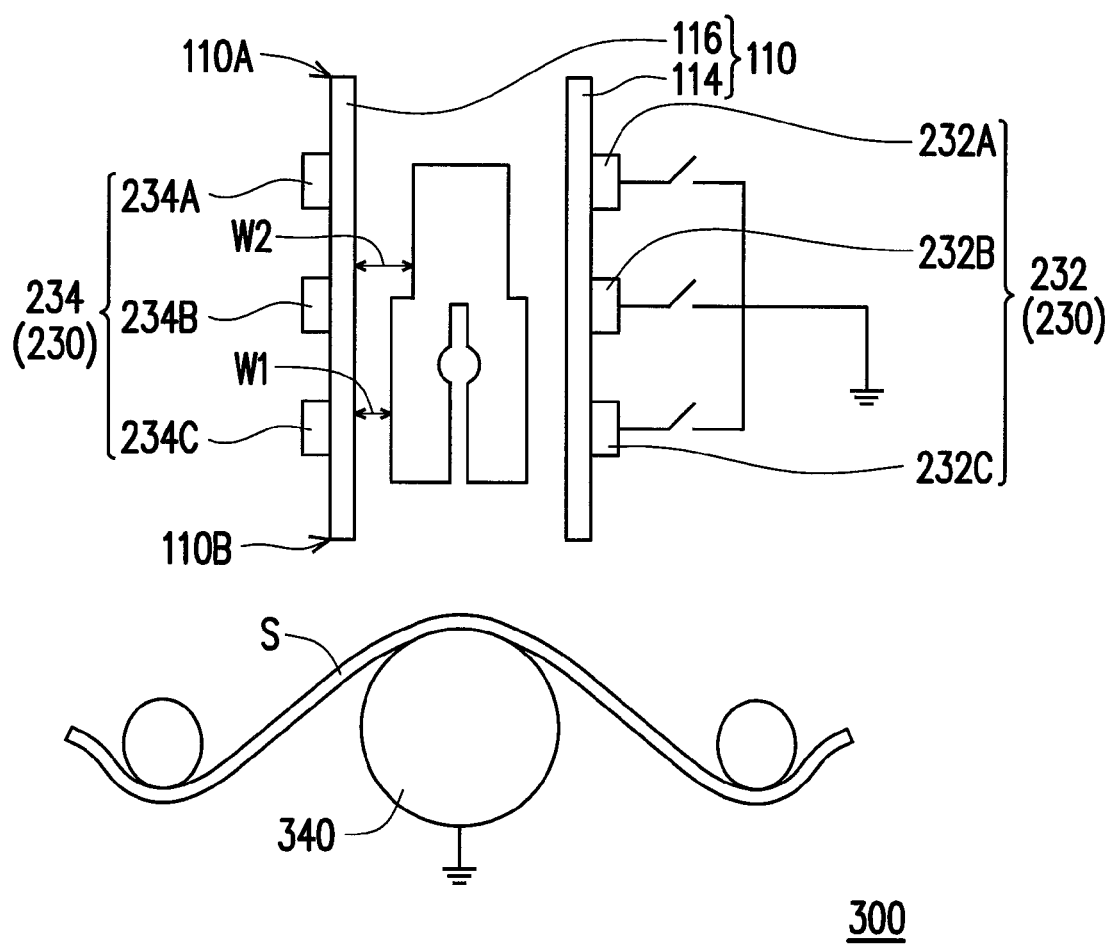
FIG. 3 is a partial cross-sectional view of the plasma device according to the third embodiment of the disclosure.

FIG. 3 is a partial cross-sectional view of the plasma device according to the third embodiment of the disclosure. With reference to FIG. 3, components of a plasma device 300 are similar to the components of the plasma device 200 of the second embodiment. Thus, the same reference numerals are used to represent the same components in the two embodiments. More specifically, a third electrode structure 340 of this embodiment is an electrically conductive roller, for example. In the case that the workpiece S is flexible, the plasma device 300 is applicable to roll to roll equipment. Other components of this embodiment may be inferred from the descriptions of the second embodiment. Thus, an operation mode and the design of other components of the plasma device 300 may be inferred from the descriptions of the second embodiment and the first embodiment.

Figure 4:
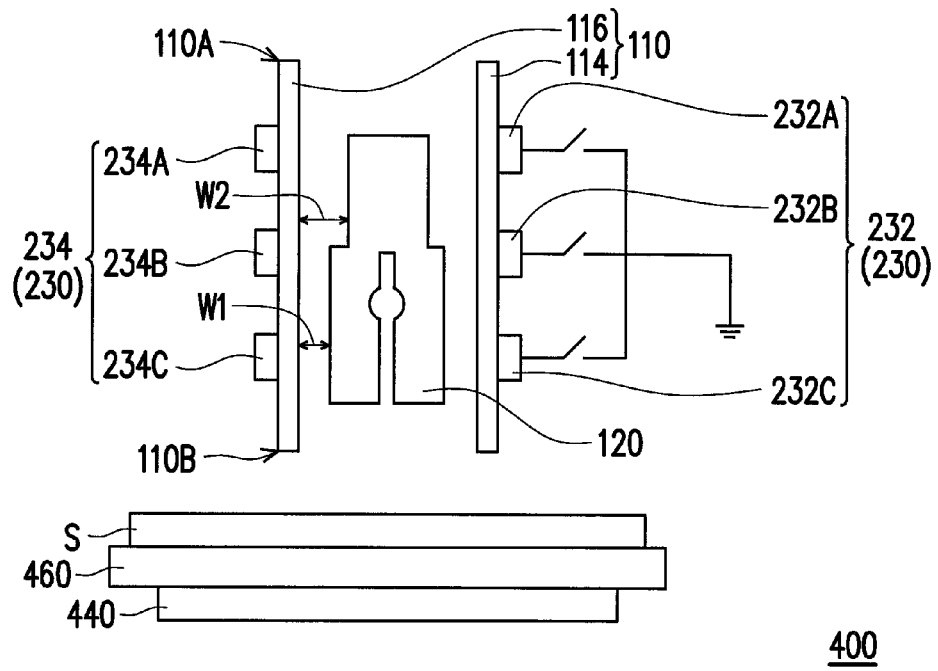
FIG. 4 is a partial cross-sectional view of the plasma device according to the fourth embodiment of the disclosure.

FIG. 4 is a partial cross-sectional view of the plasma device according to the fourth embodiment of the disclosure. With reference to FIG. 4, components of a plasma device 400 are similar to the components of the plasma device 200 of the second embodiment. Thus, the same reference numerals are used to represent the same components in the two embodiments. More specifically, a third electrode structure 440 of this embodiment is provided on a carrying platform 460, and the third electrode structure 440 is disposed on the carrying platform 460. The carrying platform 460 is adapted for carrying and keeping the workpiece S between the third electrode structure 440 and the first electrode structure 120. Here, the third electrode structure 440 does not directly carry the workpiece S and thus does not necessarily have a large-area carrying surface. Moreover, the carrying platform 460 may be an insulating carrying platform having no conductivity.

Figure 5:
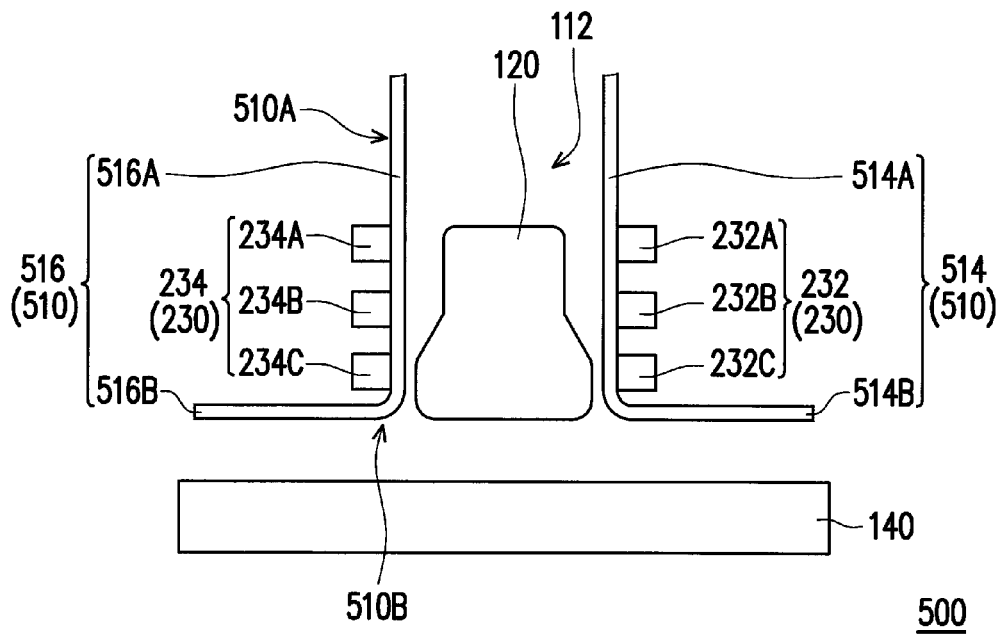
FIG. 5 is a partial cross-sectional view of the plasma device according to the fifth embodiment of the disclosure.

FIG. 5 is a partial cross-sectional view of the plasma device according to the fifth embodiment of the disclosure. With reference to FIG. 5, components of a plasma device 500 are similar to the components of the plasma device 200 of the second embodiment. Thus, the same reference numerals are used to represent the same components in the two embodiments. More specifically, in this embodiment, a dielectric barrier 510 has an upstream terminal 510A and a downstream terminal 510B. A first baffle 514 of the dielectric barrier 510 includes a first baffle portion 514A and a second baffle portion 514B, and a second baffle 516 of the dielectric barrier 510 includes a first baffle portion 516A and a second baffle portion 516B.

In terms of the first baffle 514, the first baffle portion 514A is located between the electrode blocks 232 and the first electrode structure 120, and the second baffle portion 514B is connected with the first baffle portion 514A. In addition, the second baffle portion 514B is located at the downstream terminal 510B and extends away from the first electrode structure 120 from an end of the first baffle portion 514A. Therefore, a cross-sectional structure of the first baffle 514 has an L-shaped outline.

In terms of the second baffle 516, the first baffle portion 516A is located between the electrode blocks 234 and the first electrode structure 120, and the second baffle portion 516B is connected with the first baffle portion 516A. The second baffle portion 516B is located at the downstream terminal 510B and extends away from the first electrode structure 120 from the first baffle portion 516A. In other words, a main difference between this embodiment and the second embodiment lies in that the first and second baffles 514 and 516 of this embodiment are bent into an L shape and do not necessarily have a two-dimensional plate-shaped structure.

Figure 6A:
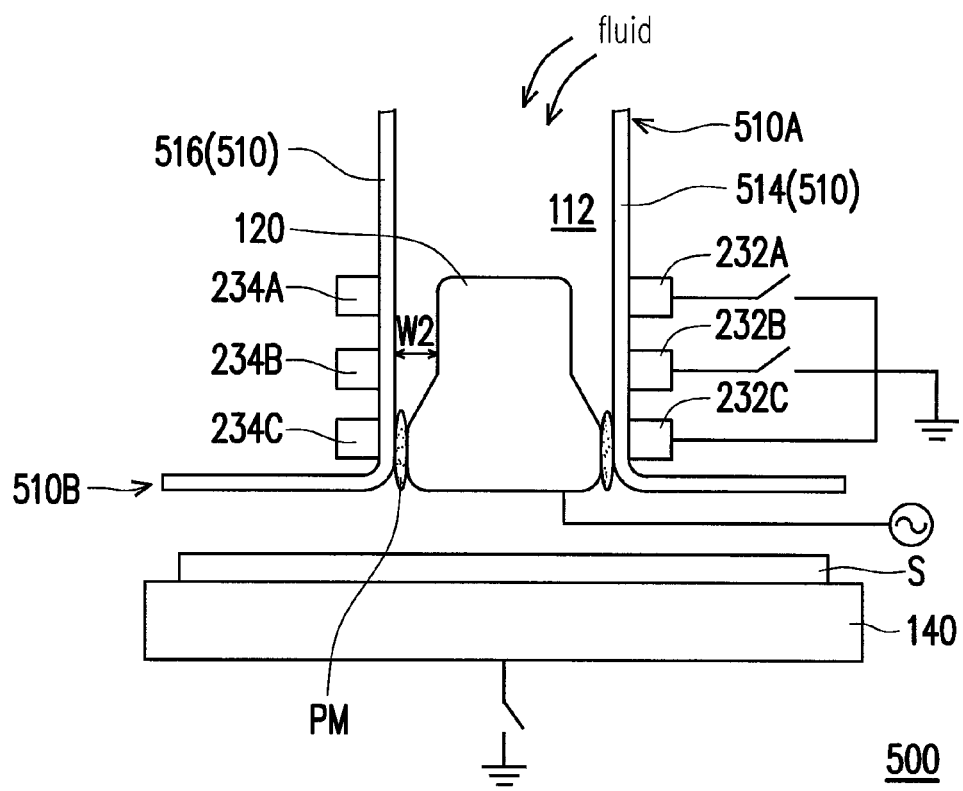
FIG. 6A to FIG. 6D illustrate the first embodiment of an operation method of the plasma device of the disclosure.

Embodiments of an operation method of the plasma device are explained below with the plasma device 500 of FIG. 5 as an example. It should be understood that the method described below is applicable to any of the aforementioned plasma devices 100-400. FIG. 6A to FIG. 6D illustrate the first embodiment of the operation method of the plasma device of the disclosure. With reference to FIG. 6A, in this embodiment, the plasma device 500 shown in FIG. 5 is provided, and the workpiece S is placed on the third electrode structure 140 to keep the workpiece S between the dielectric barrier 510 and the third electrode structure 140. Moreover, the operation method of this embodiment includes a pre-processing step and a workpiece processing step. The pre-processing step includes introducing the fluid into the space 112 from the upstream terminal 510A, applying a first operating voltage to the first electrode structure 120, and applying a second operating voltage to the electrode blocks 232C and 234C of the second electrode structure, wherein the electrode blocks 232C and 234C are closest to the third electrode structure 140 among the electrode blocks of the second electrode structure. In the pre-processing step, no operating voltage is applied to the third electrode structure 140.

When the fluid is introduced into the space 112 from the upstream terminal 510A, the fluid flows through the gap between the first electrode structure 120 and the dielectric barrier 510 and then toward the workpiece S. In the case that the first electrode structure 120 has the structure design as shown in FIG. 1C and FIG. 1D, the fluid may also flow toward the workpiece S through the through hole 122 of the first electrode structure 120B. Furthermore, in the case that the first electrode structure 120 has the structure design as shown in FIG. 1E and FIG. 1F, the plasma device 500 may allow another fluid to flow from the inflow end 124A of the fluid through hole 124 to the downstream terminal through the fluid through hole 124 and then toward the workpiece S. Here, the fluid flowing through the gap between the first electrode structure 120 and the dielectric barrier 510 may be deemed as the first fluid, and the fluid flowing through the fluid through hole may be deemed as the second fluid. The first fluid and the second fluid may be the same or different fluids.

In this embodiment, the fluid in the gap between the first electrode structure 120 and the dielectric barrier 510 generates plasma PM due to voltages of the first electrode structure and the second electrode structure. More specifically, due to influence of the design of the shape of the first electrode structure 120, the electrode blocks 232C and 234C are closest to the first electrode structure 120 among the electrode blocks of the second electrode structure. Therefore, the plasma PM is generated or ignited more easily between the electrode blocks 232C and 234C and the first electrode structure 120. In contrast thereto, the electrode blocks 232A and 234A and the first electrode structure 120 have the longest distance therebetween, which is relatively difficult for generating or igniting the plasma PM. Thus, in order to ignite the plasma PM more easily, this embodiment applies the second operating voltage to the electrode blocks 232C and 234C and temporarily withholds applying the second operating voltage to the electrode blocks 232A, 232B, 234A, and 234B.

In this step, the first operating voltage is a non-grounding voltage while the second operating voltage is a grounding voltage, for example. Therefore, when the first operating voltage is adjusted to a proper condition, the plasma PM is generated or ignited between the first electrode structure 120 and the electrode blocks 232C and 234C. The adjustment of the first operating voltage may be determined according to the type of the fluid that is injected and the state of the plasma PM that is to be generated. In an embodiment, the first operating voltage is provided to the first electrode structure 120 by a high-frequency power supply (not shown), and a frequency of the high-frequency power supply may be up to 13.56 MHz or a multiple of this value. Moreover, the fluid injected into the space 112 includes argon, helium, or a combination thereof to serve as a main gas for maintaining plasma generation. A reactant, e.g. oxygen, required for the process may be added to the main gas. Nevertheless, the added reactant is not necessarily a gas. In an embodiment, the additive includes an atomized liquid. More specifically, the liquid is atomized in an atomizer and then introduced into the plasma device 500 by a carrier gas.

Figure 6B:
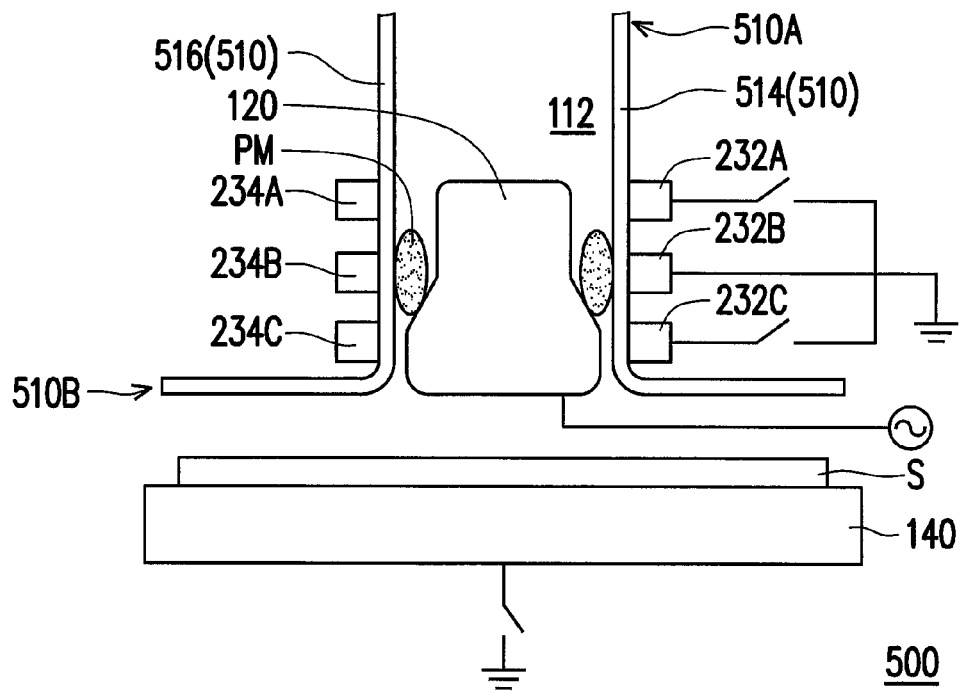
Figure 6C:
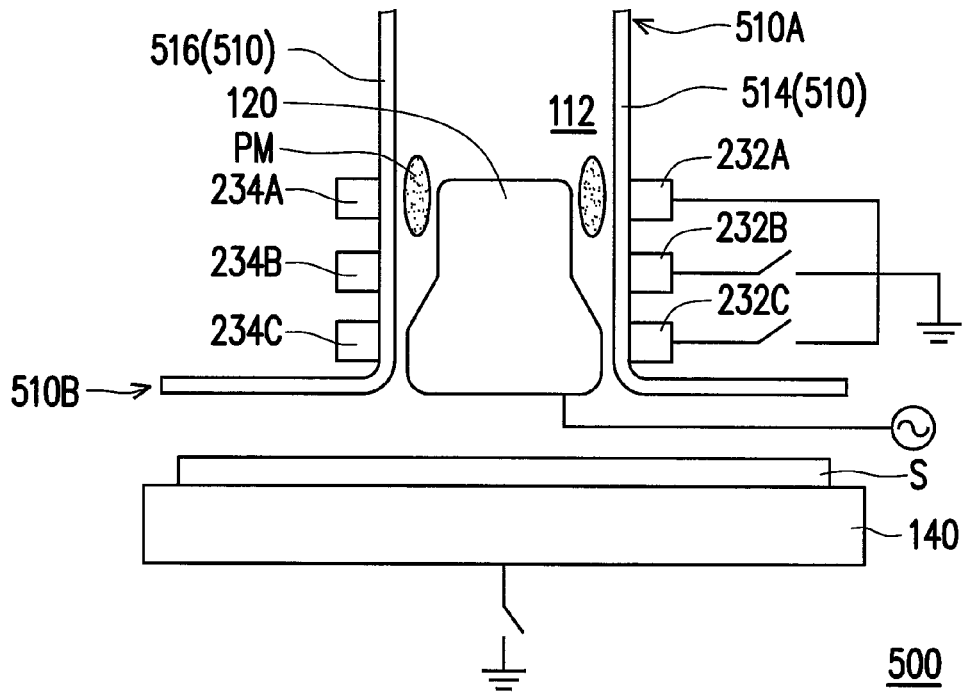

In this embodiment, in addition to the process shown in FIG. 6A, the pre-processing step further includes the processes shown in FIG. 6B and FIG. 6C for controlling and generating the plasma PM in a specific area between the first electrode structure 120 and the second electrode structure 230. That is to say, the pre-processing step of this embodiment is substantially to apply the second operating voltage to the electrode blocks 232 and 234 in sequence from the near to the distant according to the distances between the electrode blocks 232 and 234 and the third electrode structure 140. FIG. 6B illustrates a state where the second operating voltage is applied to the electrode blocks 232B and 234B. Meanwhile, the second operating voltage is no longer applied to the electrode blocks 232C and 234C, and the third electrode structure 140 is still not applied with any voltage. Accordingly, the plasma PM is gradually moved toward the upstream terminal 510A and is generated between the electrode blocks 232B and 234B and the first electrode structure 120. A relatively great distance (corresponding to the larger width W2) is maintained between the electrode blocks 232B and 234B and the first electrode structure 120 for the plasma PM. Thus, when the reactant is added to or generated in the plasma PM, obstruction of the flow passage (the space 112 between the first electrode structure 120 and the electrode blocks 232C and 234C) caused by deposition of the reactant is reduced. In addition, since the plasma PM has been ignited in the pre-processing step of FIG. 6A, even though the distance between the electrode blocks 232B and 234B and the first electrode structure 120 is greater, the space therebetween remains in the plasma state.

In terms of FIG. 6C, the second operating voltage is applied in sequence to the electrode blocks 232C and 234C, then switched to the electrode blocks 232B and 234B, and finally to the electrode blocks 232A and 234A. Meanwhile, the second operating voltage is no longer applied to the electrode blocks 232C, 234C, 232B, and 234B, and the third electrode structure 140 is still not applied with any voltage. Therefore, the plasma PM gradually moves toward the upstream terminal 510A between the electrode blocks 232A and 234A and the first electrode structure 120. The pre-processing step of FIG. 6B and FIG. 6C shows that, by switching application of the second operating voltage, the plasma PM is generated in the specific area between the first electrode structure and the second electrode structure, which is also called a step of selecting a plasma generation area. After the plasma PM is generated (FIG. 6A), the second operating voltage may be applied to electrode blocks other than the electrode blocks 232C and 234C. Accordingly, the plasma PM is generated in the wider area (e.g. between the electrode blocks 232A and 234A and the first electrode structure 120) of the flow passage, thereby increasing the area for generating the plasma PM. Consequently, a substance in the plasma PM is further reacted to improve a decomposition rate of a reactive precursor in the plasma PM. In particular, if the rate or probability of generating deposition from the plasma PM is low, the second operating voltage may be applied to electrode blocks other than the electrode blocks 232C and 234C to help generate the plasma PM in the wider area such that the reaction area is increased and the generation of the plasma PM is not limited to a partial narrow area.

Figure 6D:
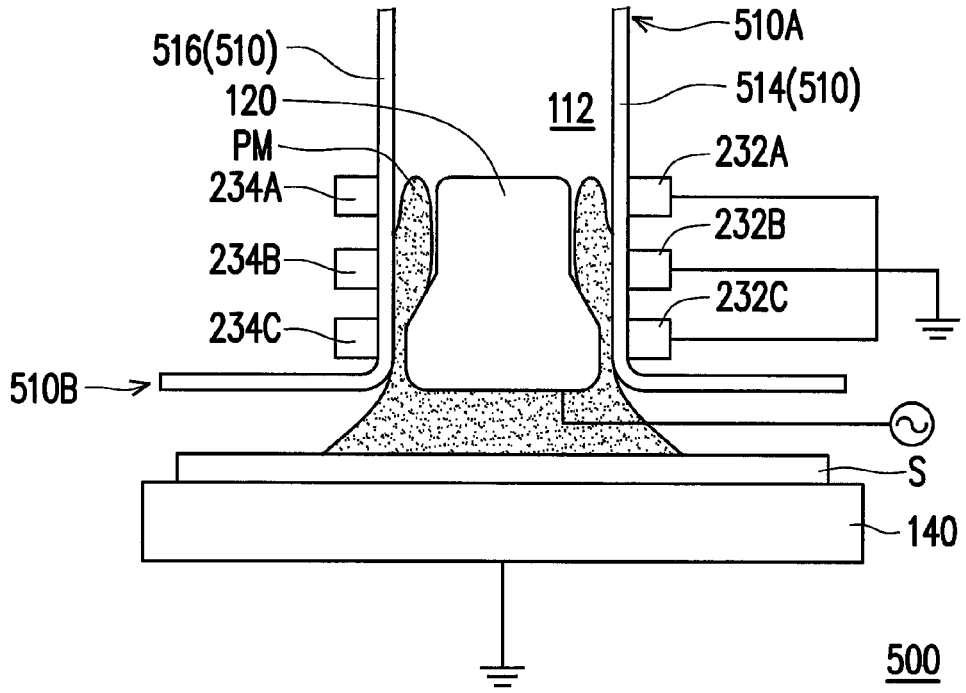

Next, with reference to FIG. 6D, after completing the aforementioned pre-processing step, a third operating voltage is applied to the third electrode structure 140. Meanwhile, the first operating voltage is continuously applied to the first electrode structure 120 and the second operating voltage is continuously applied to each of the electrode blocks 232 and 234 of the second electrode structure 230, wherein the second operating voltage and the third operating voltage are both grounding voltages. Accordingly, the plasma PM flows to the workpiece S for processing the workpiece S. In other words, the step of FIG. 6D may be deemed as the workpiece processing step, in which the plasma PM actually processes the workpiece S. The workpiece processing step may provide different functions, such as coating and surface modification, according to the reaction and effect between the plasma PM and the workpiece S. Thus, in this embodiment, the workpiece processing step is not restricted to providing a certain function. Furthermore, in FIG. 6D, each of the electrode blocks 232 and 234 is continuously applied with the second operating voltage such that the plasma PM has a larger reaction area.

Figure 7:
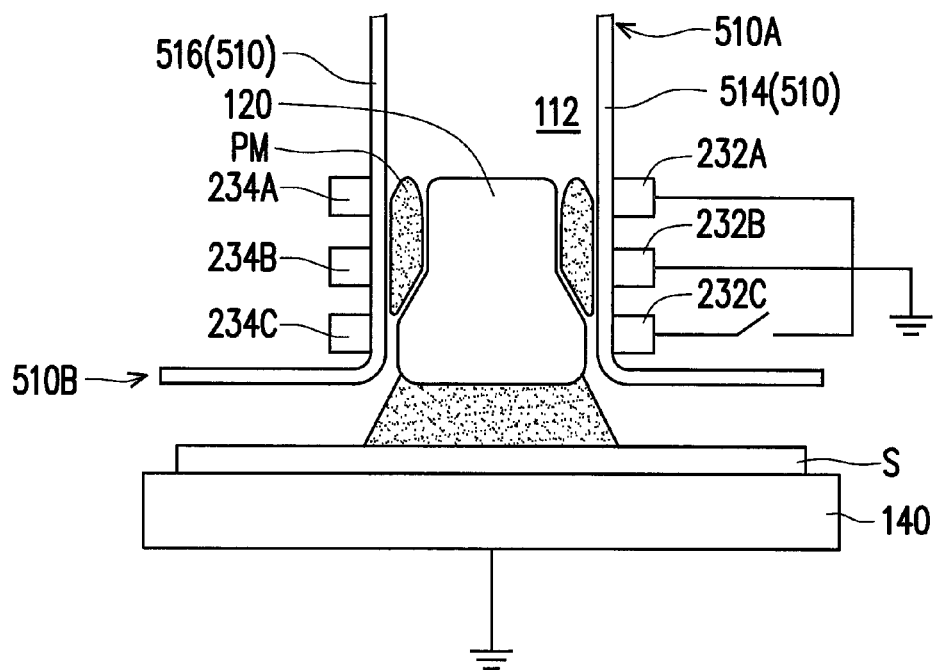
FIG. 7 illustrates the second embodiment of the operation method of the plasma device of the disclosure.

FIG. 7 illustrates the second embodiment of the operation method of the plasma device of the disclosure. In this embodiment, the workpiece processing step of FIG. 7 is carried out after the pre-processing step of FIG. 6A to FIG. 6C of the previous embodiment is performed. A main difference between the steps shown in FIG. 7 and FIG. 6D is that: in FIG. 7, when performing the workpiece processing step, the electrode blocks 232C and 234C of the second electrode structure, which are closest to the third electrode structure 140, are not applied with any voltage while the electrode blocks 232A, 232B, 234A, and 234B are respectively applied with the second operating voltage. That is to say, the electrode blocks 232C and 234C in FIG. 7 are floating. Accordingly, no plasma is formed near the electrode blocks 232C and 234C (where the flow passage is narrowest), so as to avoid causing deposition in the narrowest portion of the flow passage.

The operation method of FIG. 7 is applicable to a situation where the gas used for plasma generation may cause deposition easily but a sufficient plasma generation area is required to increase reactivity. In other words, when carrying out the plasma processing, i.e. when performing the workpiece processing step to actually process the workpiece S with the plasma PM, application of the second operating voltage to the electrode blocks 232C and 234C of the second electrode structure is stopped to avoid deposition in the narrowest portion of the flow passage. That is, according to the type of the added reactant, the operator may choose to apply the second operating voltage to all or only a portion of the electrode blocks of the second electrode structure for plasma processing.

The previous embodiment illustrates that the pre-processing step includes two stages, i.e. igniting the plasma PM (FIG. 6A) and selecting the plasma generation area (FIG. 6B and FIG. 6C). However, this disclosure is not limited thereto. In the operation method of the plasma device of an embodiment, the step of FIG. 6D may be performed directly after the step of FIG. 6A is completed, or the step of FIG. 7 may be performed after the step of FIG. 6A is completed. Alternatively, in other embodiments, after the step of FIG. 6A is completed, one of the steps of FIG. 6B and FIG. 6C may be performed, and then one of the steps of FIG. 6D and FIG. 7 may be performed.

Figure 8:
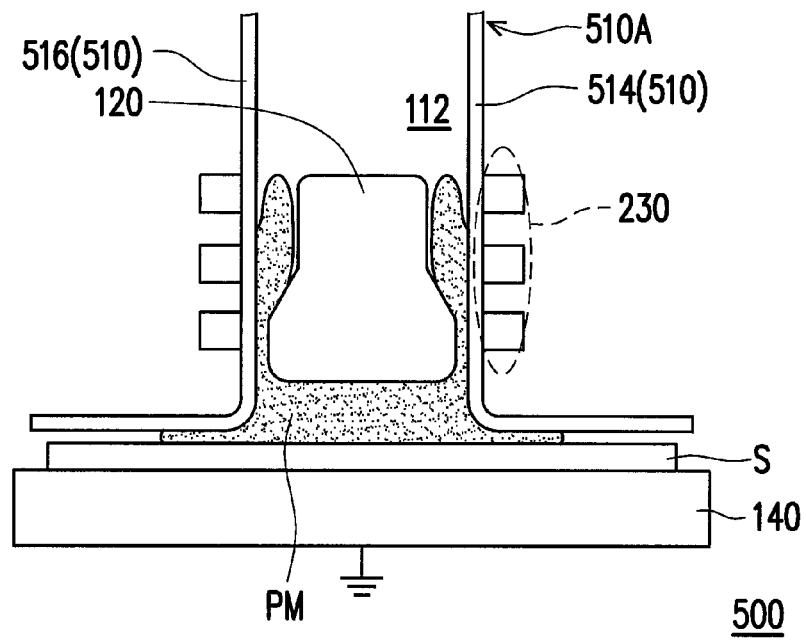
FIG. 8 is a schematic view of a plasma device 500 in use.

The following descriptions are based on the plasma device 500 as an example. FIG. 8 is a schematic view of the plasma device 500 in use. With reference to FIG. 5 and FIG. 8, when the plasma device 500 performs surface processing on the workpiece S, the dielectric barrier 510 moves toward the third electrode structure 140 (the workpiece S) from the state of FIG. 5. The distance between the dielectric barrier 510 and the third electrode structure 140 decreases accordingly, and the dielectric barrier 510 effectively blocks external air from flowing into the space between the first electrode structure 120 and the third electrode structure 140. As a result, the plasma PM generated by the plasma device 500 is not easily diluted or contaminated by the external air and can effectively process the workpiece S.

The dielectric barrier 510 described in the previous embodiment is designed to be movable, which is conducive to improving the processing efficiency of the plasma device, such that ideal processing results are achieved even in a low power state. It is worth mentioning that, although FIG. 10 is illustrated based on the plasma device 500, any one of the dielectric barriers in the plasma devices 100, 200, 300, and 400 of the other embodiments may also be designed to be movable.

Figure 9:
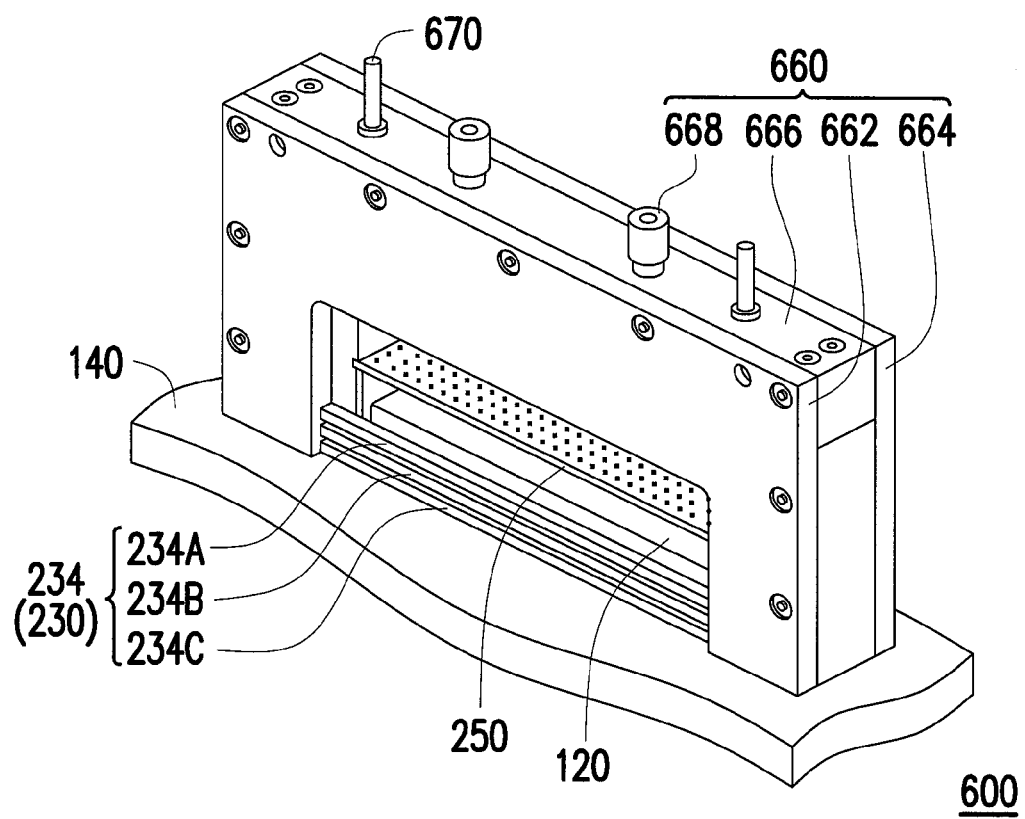
FIG. 9 is a schematic view of the plasma device of FIG. 5, which is designed as a linear plasma device.

The plasma device described in the previous embodiment may be designed as a linear plasma device. For example, FIG. 9 is a schematic view of the plasma device of FIG. 5, which is designed as a linear plasma device, and FIG. 10 is a schematic view of a dielectric barrier, a first electrode structure, a second electrode structure, and a third electrode structure in the plasma device of FIG. 9. With reference to FIG. 9 and FIG. 10, in the case that the plasma device is designed as a linear plasma device 600, the first electrode structure 120, the second electrode structure 230, and the third electrode structure 510 are disposed in a housing 660. The housing 660 includes side plates 662 and 664 that are opposite to each other, a frame 666 connected between the two side plates 662 and 664, and an inflow structure 668 disposed on the frame 666 for introducing the fluid. In addition, the linear plasma device 600 may include a connection part 670 for connecting the first electrode structure 120 to a power supply, wherein the connection part 670 may extend outward from the frame 666.

Figure 10:
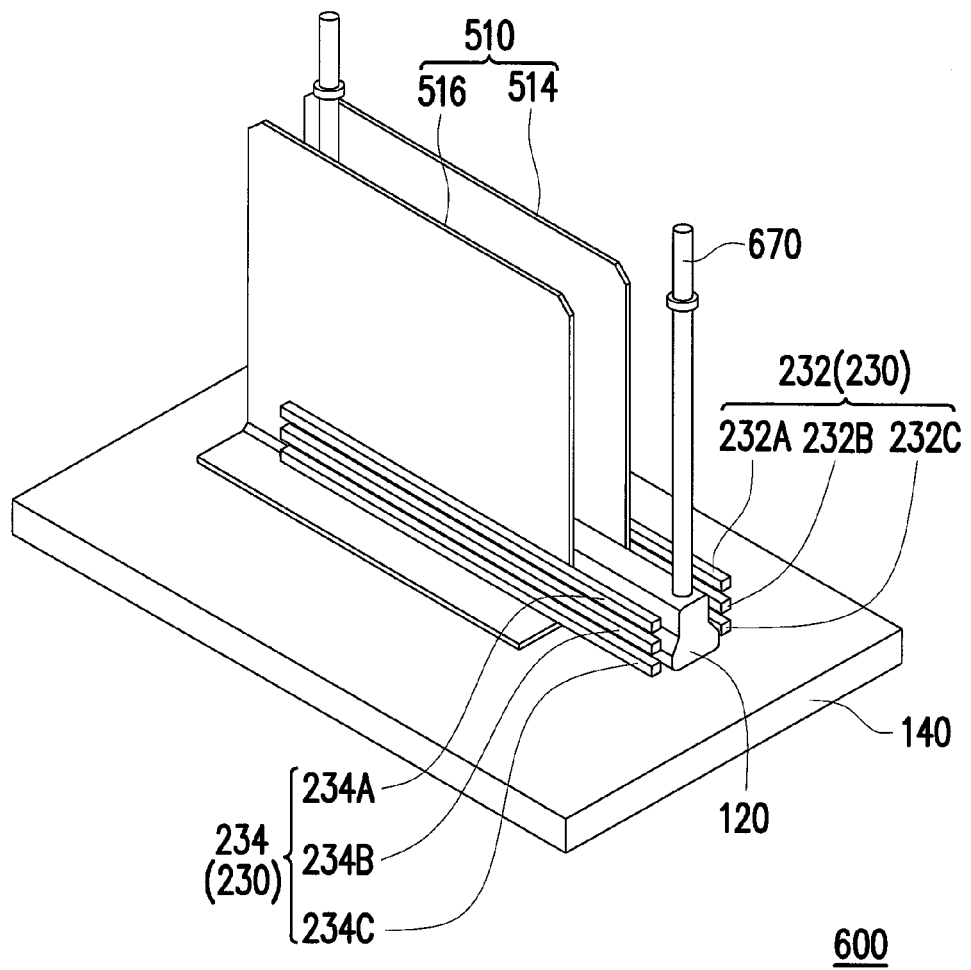
FIG. 10 is a schematic view of a dielectric barrier, a first electrode structure, a second electrode structure, and a third electrode structure in the plasma device of FIG. 9.

It is known from FIG. 9 and FIG. 10 that the first electrode structure 120 is an elongated electrode structure, and the outline of the cross section of the first electrode structure 120 is small at the top and large at the bottom. Each of the electrode blocks 232 and 234 of the second electrode structure 230 is an elongated electrode block. The first baffle 514 and the second baffle 516 of the dielectric barrier 510 are respectively disposed on two opposite sides of the first electrode structure 120. In addition, the third electrode structure 140 is a plate-shaped electrode that provides a function of carrying the workpiece.

Figure 11:
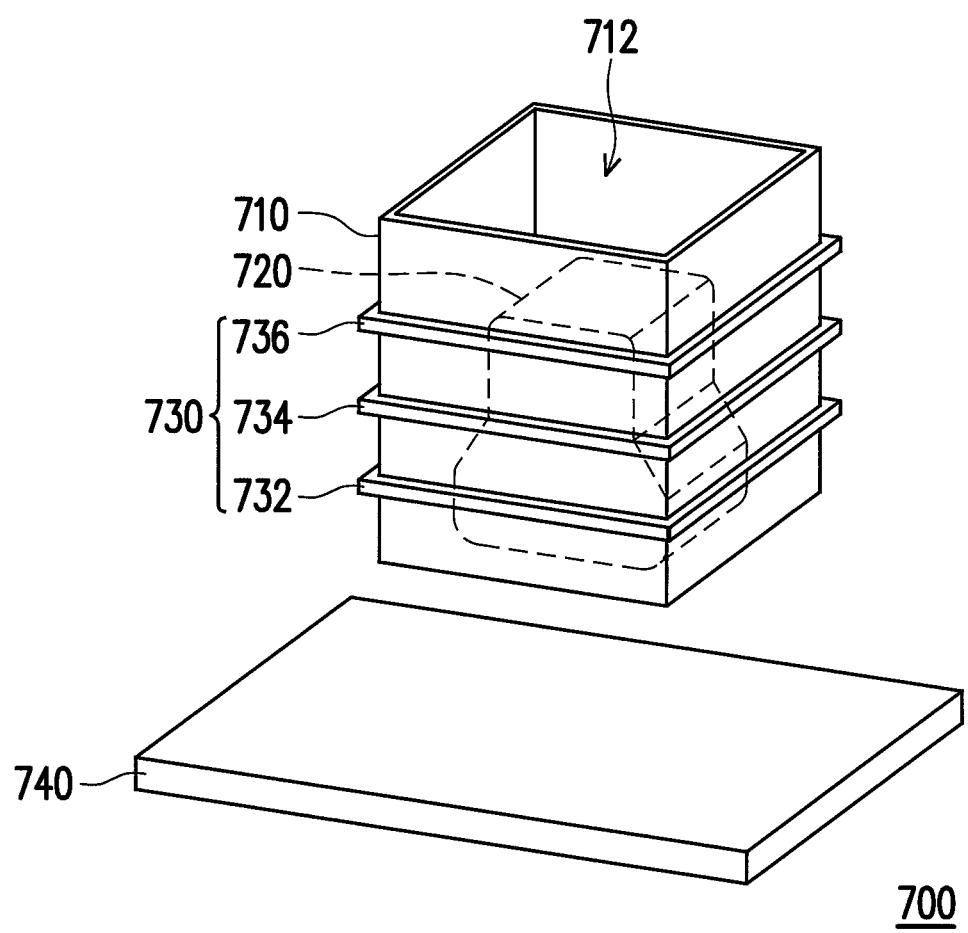
FIG. 11 is a schematic view of the plasma device of FIG. 5, which is designed as an annular plasma device.

FIG. 11 is a schematic view of the plasma device of FIG. 5, which is designed as an annular plasma device. With reference to FIG. 11, an annular plasma device 700 includes a dielectric barrier 710, a first electrode structure 720, a second electrode structure 730, and a third electrode structure 740. Here, the dielectric barrier 710 is an annular barrier, which substantially defines a space 712 with a plurality of baffles. The dielectric barrier 710 is disposed above the third electrode structure 740. The first electrode structure 720 is disposed in the space 712 surrounded by the dielectric barrier 710. In this embodiment, the first electrode structure 720 has a structure that is small at the top and large at the bottom. However, it should be noted that the structure of the first electrode structure 720 is not restricted to the illustration of FIG. 11, and the first electrode structure 720 may have the structure respectively shown in FIG. 1A to FIG. 1F. The second electrode structure 730 includes electrode blocks 732, 734, and 736. Each of the electrode blocks 732, 734, and 736 is an annular electrode and may be electrically driven independently. In other words, when the annular plasma device 700 is operated, voltages may not be simultaneously applied to the electrode blocks 732, 734, and 736. It is worth mentioning that, if the plasma device 500 of FIG. 5 has the structure as shown in FIG. 11, the electrode blocks 232A and 234A are substantially different portions of one annular electrode and thus are driven at the same time and have the same potential. Likewise, the electrode blocks 232B and 234B are substantially different portions of one annular electrode, and the electrode blocks 232C and 234C are substantially different portions of one annular electrode.

To conclude the above, the plasma device of the embodiment of this disclosure generates plasma in the gap between the first electrode structure and the dielectric barrier efficiently and causes the generated plasma to flow toward the third electrode structure for processing the workpiece between the third electrode structure and the first electrode structure. In the case that the dielectric barrier of the embodiment of this disclosure is designed as a movable barrier, by moving the dielectric barrier closer to the third electrode structure, the generated plasma is more concentrated when flowing toward the workpiece.

What is claimed is:

1. A plasma device, comprising:
   a dielectric barrier comprising an upstream terminal and a downstream terminal and defining a space, wherein the dielectric barrier is a movable dielectric barrier, and a distance between the dielectric barrier and the third electrode structure is changeable;
   a first electrode structure disposed in the space, wherein a gap is formed between the first electrode structure and the dielectric barrier, and the gap has multiple widths;
   a second electrode structure disposed around the first electrode structure, wherein the dielectric barrier is located between the first electrode structure and the second electrode structure, and the second electrode structure comprises a plurality of electrode blocks that are arranged in sequence from the upstream terminal to the downstream terminal; and
   a third electrode structure, wherein the dielectric barrier, the first electrode structure, and the second electrode structure are located on the same side of the third electrode structure, and the third electrode structure is located at the downstream terminal of the dielectric barrier, wherein a minimum distance between the electrode blocks and the third electrode structure is not less than a distance between the first electrode structure and the third electrode structure.

2. The plasma device according to claim 1, wherein a first width of the gap near the downstream terminal is less than a second width of the gap away from the downstream terminal.

3. The plasma device according to claim 1, wherein the first electrode structure comprises a first width portion and a second width portion, wherein a width of the first width portion is greater than a width of the second width portion, and the first width portion is located between the second width portion and the third electrode structure.

4. The plasma device according to claim 1, wherein the width of the gap decreases as being closer to the downstream terminal.

5. The plasma device according to claim 1, wherein a width of the first electrode structure increases as being closer to the downstream terminal.

6. The plasma device according to claim 1, wherein the electrode blocks are electrically driven independently.

7. The plasma device according to claim 1, wherein the third electrode structure comprises a carrying surface configured to carry a workpiece and place the workpiece between the third electrode structure and the first electrode structure.

8. The plasma device according to claim 1, further comprising a carrying platform, on which the third electrode structure is disposed, wherein the carrying platform is configured to carry a workpiece and place the workpiece between the third electrode structure and the first electrode structure.

9. The plasma device according to claim 1, wherein the first electrode structure has an oxide surface layer.

10. The plasma device according to claim 1, wherein the distance between the first electrode structure and the third electrode structure is less than or equal to 4 mm.

11. The plasma device according to claim 1, wherein the first electrode structure comprises at least one through hole, through which a fluid flows from the upstream terminal to the downstream terminal.

12. The plasma device according to claim 1, wherein the first electrode structure comprises at least one fluid through hole that comprises an inflow end, from which a fluid flows through the fluid through hole to the downstream terminal, wherein the fluid through hole does not communicate with the upstream terminal.

13. The plasma device according to claim 1, wherein the dielectric barrier comprises a first baffle and a second baffle that are disposed opposite to each other to surround and define the space, wherein the first baffle is located between a portion of the electrode blocks and the first electrode structure, and the second baffle is located between another portion of the electrode blocks and the first electrode structure.

14. The plasma device according to claim 13, wherein the first baffle comprises a first baffle portion and a second baffle portion, wherein the first baffle portion is located between the portion of the electrode blocks and the first electrode structure, and the second baffle portion located at the downstream terminal is connected with the first baffle portion and extends away from the first electrode structure from the first baffle portion.

15. The plasma device according to claim 13, wherein the second baffle comprises a first baffle portion and a second baffle portion, wherein the first baffle portion is located between the another portion of the electrode blocks and the first electrode structure, and the second baffle portion located at the downstream terminal is connected with the first baffle portion and extends away from the first electrode structure from the first baffle portion.

16. The plasma device according to claim 1, wherein the dielectric barrier surrounds and defines the space, and each of the electrode blocks of the second electrode structure is an annular electrode.

17. An operation method of a plasma device, wherein the plasma device comprises:
- a dielectric barrier comprising an upstream terminal and a downstream terminal and defining a space;
- a first electrode structure disposed in the space, wherein a gap is formed between the first electrode structure and the dielectric barrier, and the gap has multiple widths;
- a second electrode structure disposed around the first electrode structure, wherein the dielectric barrier is located between the first electrode structure and the second electrode structure, and the second electrode structure comprises a plurality of electrode blocks that are arranged in sequence from the upstream terminal to the downstream terminal; and
- a third electrode structure, wherein the dielectric barrier, the first electrode structure, and the second electrode structure are located on the same side of the third electrode structure, and the third electrode structure is located at the downstream terminal of the dielectric barrier, wherein a minimum distance between the electrode blocks and the third electrode structure is not less than a distance between the first electrode structure and the third electrode structure, and the operation method comprising:

placing a workpiece between the dielectric barrier and the third electrode structure;

introducing a first fluid into the space from the upstream terminal;

applying a first operating voltage to the first electrode structure;

applying a second operating voltage to at least one of the electrode blocks of the second electrode structure; and applying a third operating voltage to the third electrode structure and reducing the distance between the dielectric barrier and the third electrode structure when applying the third operating voltage to the third electrode structure, wherein a method of reducing the distance between the dielectric barrier and the third electrode structure comprises moving the dielectric barrier closer to the third electrode structure.

18. The operation method according to claim 17, wherein the second operating voltage and the third operating voltage are grounding voltages, and the first operating voltage is a non-grounding voltage.

19. The operation method according to claim 17, further comprising applying the second operating voltage to the at least one of the electrode blocks of the second electrode structure for performing a pre-processing step before applying the third operating voltage to the third electrode structure.

20. The operation method according to claim 19, wherein the pre-processing step comprises applying the second operating voltage to one of the electrode blocks which is closest to the third electrode structure.

21. The operation method according to claim 19, wherein the pre-processing step comprises applying the second operating voltage to the electrode blocks in sequence from the near to the distant according to distances between the electrode blocks and the third electrode structure.

22. The operation method according to claim 19, further comprising applying the second operating voltage to each of the electrode blocks and applying the third operating voltage to the third electrode structure for performing a workpiece processing step after the pre-processing step.

23. The operation method according to claim 19, further comprising applying the second operating voltage to the electrode blocks except for the electrode block closest to the third electrode structure and applying the third operating voltage to the third electrode structure for performing the workpiece processing step after the pre-processing step.

24. The operation method according to claim 17, wherein the first fluid comprises argon, helium, or a combination thereof.

25. The operation method according to claim 17, wherein the first electrode structure comprises at least one fluid through hole that comprises an inflow end, and the operation method further comprises allowing a second fluid to flow from the inflow end to the downstream terminal through the fluid through hole, wherein the fluid through hole does not communicate with the upstream terminal.

26. The operation method according to claim 25, wherein the first fluid is different from the second fluid.

27. The operation method according to claim 17, wherein the first fluid at least flows through the gap and flows to the workpiece from the downstream terminal.

28. The operation method according to claim 17, wherein the first fluid generates a plasma in the gap due to the first operating voltage and the second operating voltage.

29. The operation method according to claim 17, wherein the first electrode structure comprises at least one through hole, through which a portion of the first fluid flows from the upstream terminal to the downstream terminal and directly flows to the workpiece.

* * * * *